United States Patent [19]

Mori

[11] Patent Number: 4,847,667
[45] Date of Patent: Jul. 11, 1989

[54] ULTRAVIOLET ERASABLE NONVOLATILE SEMICONDUCTOR MEMORY DEVICE

[75] Inventor: Seiichi Mori, Tokyo, Japan

[73] Assignee: Kabushiki Kaisha Toshiba, Kawasaki, Japan

[21] Appl. No.: 159,963

[22] Filed: Feb. 24, 1988

[30] Foreign Application Priority Data

Feb. 27, 1987 [JP] Japan .................................. 62-42925
Jul. 13, 1987 [JP] Japan .................................. 62-174111

[51] Int. Cl.$^4$ .......................................... H01L 29/78
[52] U.S. Cl. .................................... 357/23.5; 357/41; 357/54; 357/73; 365/185
[58] Field of Search ..................... 357/23.5, 41, 54, 73; 365/185

[56] References Cited

U.S. PATENT DOCUMENTS 4,763,177 8/1988 Paterson ............................ 357/23.5

FOREIGN PATENT DOCUMENTS 62-125679 6/1987 Japan .................................. 357/23.5

Primary Examiner—Joseph E. Clawson, Jr.
Attorney, Agent, or Firm—Finnegan, Henderson, Farabow, Garrett, & Dunner

[57] ABSTRACT

In a step of forming an interlayer insulation film between memory elements in an ultraviolet erasable nonvolatile semiconductor memory device and an upper metal wiring layer, a thermal oxide film is formed on a semiconductor substrate and around the stacked gate, and a boron and phosphorus doped oxide film is formed on a phosphorus doped oxide film which is formed on the thermal oxide film. Then, a heat treatment is effected to cause the boron and phosphorus doped oxide film to melt and fill the concave portion on the surface of the phosphorus doped oxide film.

9 Claims, 5 Drawing Sheets

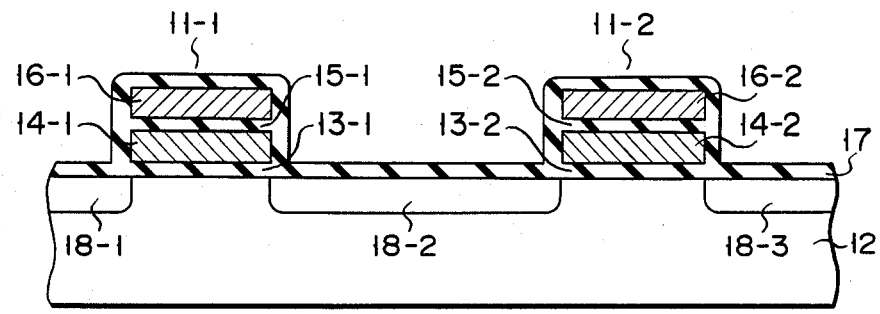
F I G. 1A
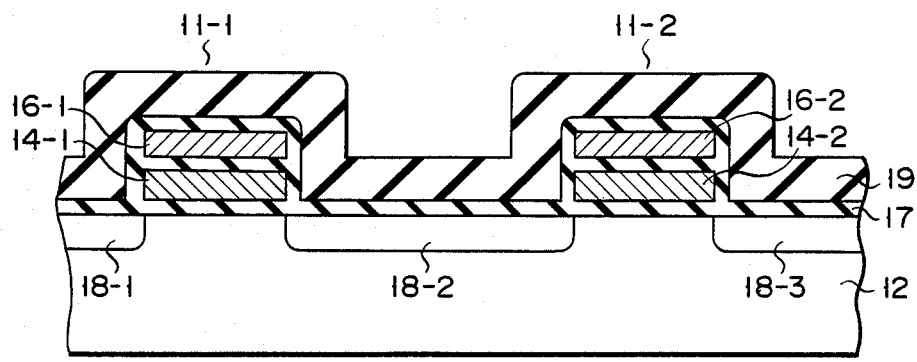
F I G. 1B
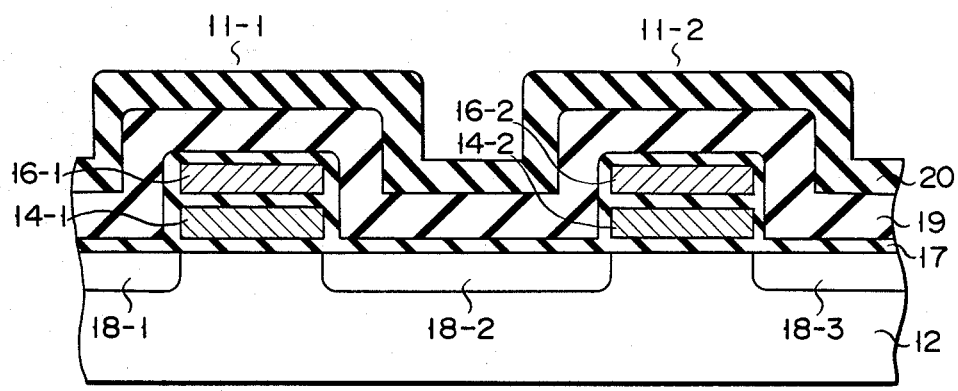
F I G. 1C

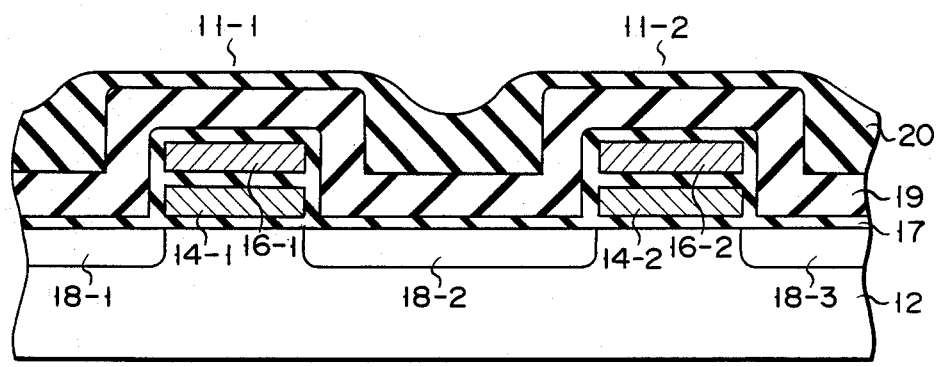
F I G. 2
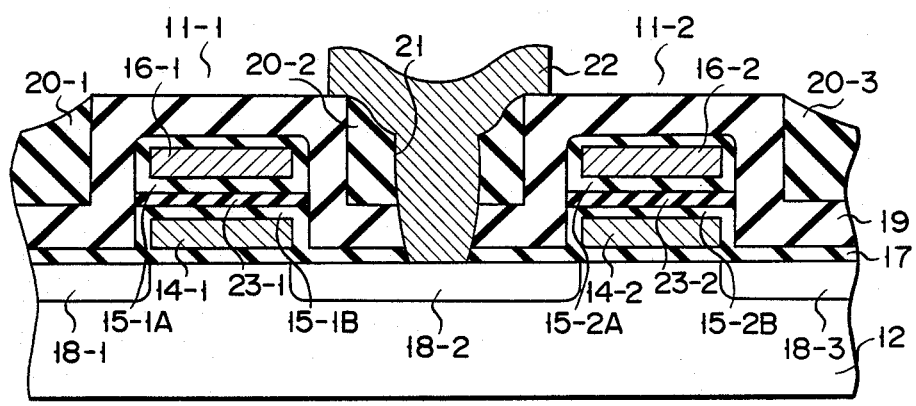
F I G. 3
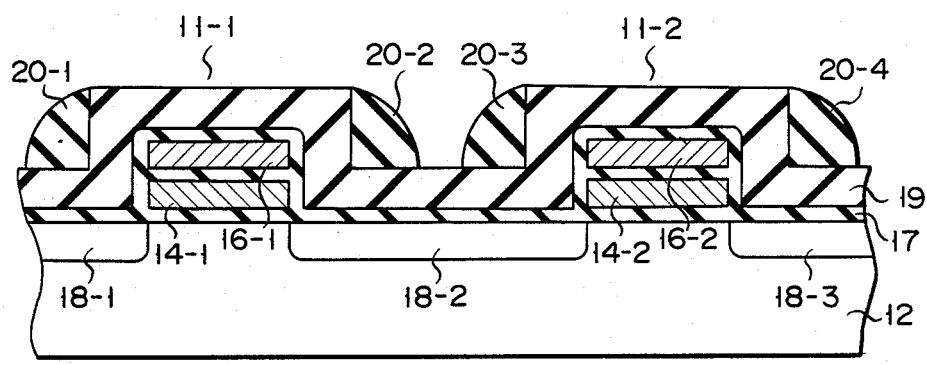
F I G. 4

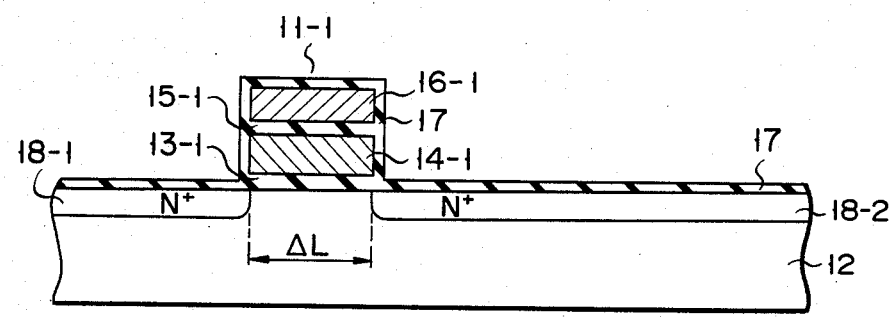
F I G. 5A
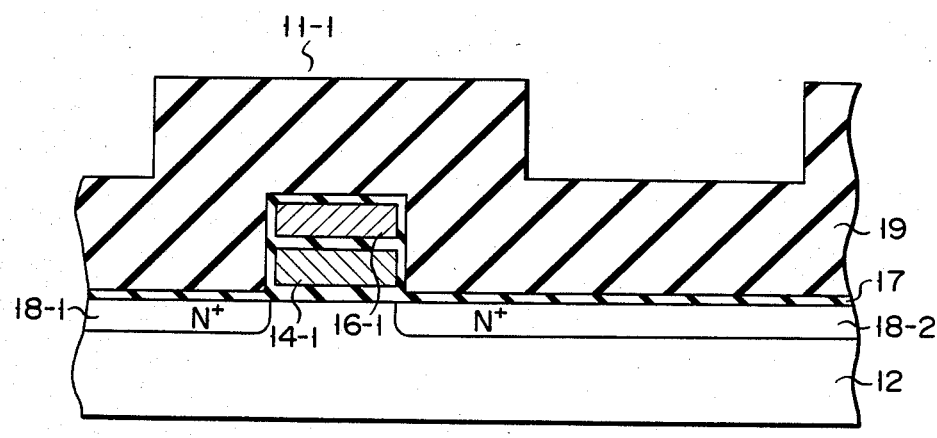
F I G. 5B
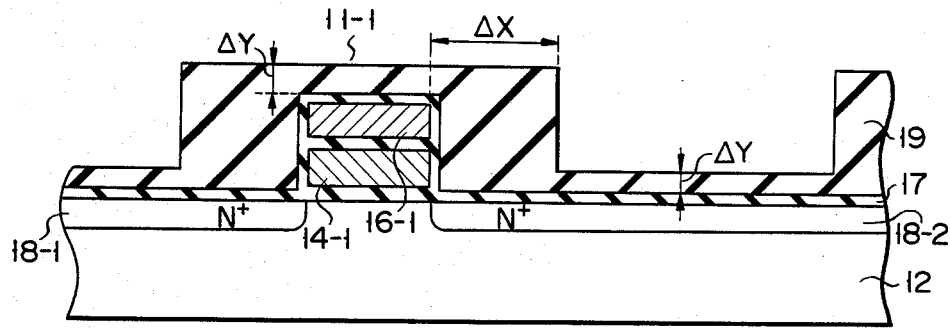
F I G. 5C

ULTRAVIOLET ERASABLE NONVOLATILE SEMICONDUCTOR MEMORY DEVICE

BACKGROUND OF THE INVENTION
1. Field of the Invention

This invention relates to a semiconductor device of stacked gate structure, and more particularly to a nonvolatile semiconductor memory device in which data can be erased by applying an ultraviolet ray and a manufacturing method therefor.
2. Description of the related art including information disclosed under §§1.97–1.99

In general, an ultraviolet erasable nonvolatile semiconductor memory device (EPROM) has a stacked gate structure of two polysilicon layers serving as a floating gate and a control gate which are formed one over the other. An insulation film provided between the two polysilicon layers and a metal wiring layer arranged over the double polysilicon layers is formed of laminated structure of a thermal oxide film and an $SiO_2$ film (PSG film) having phosphorus of $1 \times 10^{20}$ $cm^{-3}$ doped therein. The PSG film melts in a heat treatment process (at about 950° C. or more) effected at a later stage, and an uneven surface of the semiconductor substrate caused by the presence of the two polysilicon layers can be made flat by the melted PSG. The planarization makes it easy to pattern the metal wiring layer formed on the insulation film and effectively prevents occurrence of defects such as disconnection of wiring layers.

However with the scaling down of recent memory elements, the maximum permissible temperature in the heat treatment process for the planarization is lowered. For this reason, it becomes difficult to attain the planarization by causing the PSG film to melt. In order to solve the problem it is considered that an $SiO_2$ film having boron and phosphorus (BPSG film) of more than $1 \times 10^{20}$ $cm^{-3}$ doped therein is used instead of the PSG film. The BPSG film has an advantage that the melting point is as low as 900° C. or less, but it has a property of making the transmission of ultraviolet rays difficult. For this reason, in the case where the BPSG film is used in the ultraviolet erasable EPROM, the data erasing speed will be lowered.

SUMMARY OF THE INVENTION

An object of this invention is to provide an ultraviolet erasable nonvolatile semiconductor memory device in which the manufacturing process can be achieved at a low temperature and decrease in the data erasing speed can be suppressed to a minimum.

According to one aspect of this invention, an ultraviolet erasable nonvolatile semiconductor memory device is provided which comprises a semiconductor substrate of one conductivity type; at least one memory element of stacked gate structure formed on the semiconductor substrate; a thermal oxide film formed on the semiconductor substrate and around the memory element; a silicon oxide film having phosphorus doped therein and formed on the thermal oxide film; and a silicon oxide film having boron and phosphorus doped therein and formed in a concave portion on the surface of the phosphorus doped silicon oxide film which lies in position corresponding to the side of the stacked gate.

With the construction described above, since the phosphorus doped silicon oxide film through which an ultraviolet ray can easily pass is formed on the second gate and near the side wall of the double-layered gate, decrease in the data erasing speed can be suppressed to a minimum. Further, since the concave portion of the refractory oxide film having phosphorus doped therein is filled with the silicon oxide film of low melting point having boron and phosphorus doped therein, the heat treatment for planarizing the stepped surface can be carried out at a low temperature.

BRIEF DESCRIPTION OF THE DRAWINGS

FIGS. 1A to 1E are cross-sectional views showing steps of manufacturing an ultraviolet erasable nonvolatile semiconductor memory device according to a first embodiment of this invention;

FIG. 2 is a cross-sectional view of an ultraviolet erasable nonvolatile semiconductor memory device according to a second embodiment of this invention;

FIG. 3 is a cross-sectional view of an ultraviolet erasable nonvolatile semiconductor memory device according to a third embodiment of this invention;

FIG. 4 is a cross-sectional view of an ultraviolet erasable nonvolatile semiconductor memory device according to a fourth embodiment of this invention; and FIGS. 5A to 5F are cross-sectional views showing steps of manufacturing an ultraviolet erasable nonvolatile semiconductor memory device according to a fifth embodiment of this invention.

DETAILED DESCRIPTION OF THE PREFERRED EMBODIMENTS

Figure 1D:
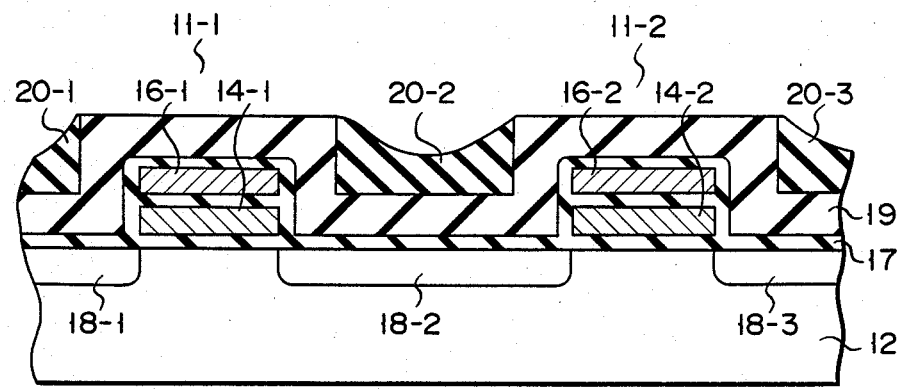

FIGS. 1A to 1E are cross-sectional views sequentially showing steps of manufacturing an ultraviolet erasable nonvolatile semiconductor memory device according to a first embodiment of this invention. As shown in FIG. 1A, two memory cell transistors 11-1 and 11-2 are formed. Memory cell transistors 11-1 and 11-2 are formed as described below. First, the main surface of P-type semiconductor substrate (silicon substrate) 12 is thermally oxidized to form a first insulation film on substrate 12, and then a first polysilicon layer is formed on the first insulation film. The first polysilicon layer is thermally oxidized to form a second insulation film thereon, and a second polysilicon layer is formed on the insulation film. The second polysilicon layer, second insulation film, first polysilicon layer and first insulation film are etched in the same pattern by a photolithographic etching process to form first gate insulation film 13-1, floating gate 14-1, second gate insulation film 15-1 and control gate 16-1 of memory cell 11-1. At the same time, first gate insulation film 13-2, floating gate 14-2, second gate insulation film 15-2 and control gate 16-2 of memory cell 11-2 are formed. Then, the entire surface of the resultant semiconductor structure is thermally oxidized to form oxide film 17 on semiconductor substrate 12, and the side walls of control gates 16-1 and 16-2 and floating gates 14-1 and 14-2. Next, N-type impurity is ion implanted into semiconductor substrate 12 with the two-layered polysilicon gates of control gates 16-1 and 16-2 and floating gates 14-1 and 14-2 as a mask. As a result, source and drain regions 18-1, 18-2 and 18-3 are formed in the surface area of semiconductor substrate 12. FIG. 1A shows the case in which two memory cell transistors 11-1 and 11-2 have common source region 18-2.

Next, as shown in FIG. 1B, PSG film 19 is deposited on the entire surface of the resultant semiconductor structure by a CVD method. PSG film 19 is formed to contain phosphorus of approx. $1 \times 10^{1020}$ $cm^{-3}$. As shown in FIG. 1C, BPSG film 20 is formed on PSG film 19. BPSG film 20 contains boron and phosphorus of approx. $1 \times 10^{21}$ cm$^{-3}$. After BPSG film 20 is formed, an annealing is carried out at a temperature of, for example, 900° C. for one hour In this process, BPSG film 20 melts (in this case, PSG film 19 does not melt at this temperature), and the BPSG portion deposited on PSG film 19 which is formed on the stacked gates of memory cell transistors 11-1 and 11-2 flows into the concave portion between the stacked gates as shown in FIG. 1D. Thus, the concave portions of PSG film 19 are filled with BPSG portions 20-1, 20-2 and 20-3, so that the surface of the PSG film 19 is planarized (or made substantially flat).

Figure 1E:
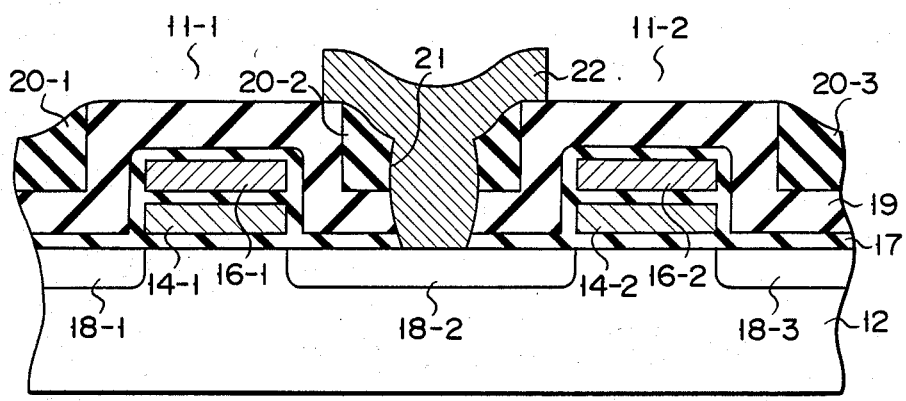

After this, as shown in FIG. 1E, contact hole 21 is formed in oxide film 17 and PSG film 19 which is planarized by BPSG 20-2 and formed over source region (or drain region) 18-2 of memory cell transistors 11-1 and 11-2. Then, an Al-Si layer is formed on PSG film 19 and BPSG film 20 by a sputtering method. The Al-Si layer is patterned by photoetching to form wiring layer 22, and then a passivation film (not shown) is formed on the entire surface of the resultant semiconductor structure to complete the EPROM.

With the device described above, since the insulation film formed on control gates 16-1 and 16-2 and on the side walls of two-layered gates 16-1, 16-2 and 14-1, 14-2 is formed of PSG film 18 through which an ultraviolet ray can easily pass, the data erasing speed is substantially the same as that in the prior art manufacturing method in which the insulation film is formed of only a PSG film. Thus, decrease in the data erasing speed can be suppressed to a minimum. Further, since BPSG film 20 having a low melting point is formed to fill the concave portion of the surface of PSG film 19 having a high melting point, temperature in the heat treatment process can be set substantially equal to that set in the case where the insulation film is formed of a BPSG film. Thus, the step portion on the surface can be planarized by the heat treatment at a low temperature. In this way, since the manufacturing process can be achieved at a low temperature, the element size can be reduced and the high integration can be attained.

In the first embodiment described above, all the portion of BPSG film 20 which lies on the stacked gates is caused to flow into the concave portion between the stacked gates. However, BPSG film 20 can be left on the stacked gate if it is thin (for example, less than 4000Å) as shown in FIG. 2. That is, since attenuation of ultraviolet ray in the BPSG film is low, no serious problem occurs even if a thin BPSG film is left on the stacked gate.

Further, in the first embodiment, gate insulation films 15-1 and 15-2 formed between floating gates 14-1 and 14-2 and control gates 16-1 and 16-2 are formed of a single-layered oxide film. However, three-layered insulation film of silicon oxide film 15-1A and 15-2A/silicon nitride film 23-1 and 23-2/ silicon oxide film 15-1B and 15-2B can be used to attain the same effect. The three-layered film is used to increase a coupling capacitance between floating gates 14-1 and 14-2 and control gates 16-1 and 16-2. It is well known in the art that, in the case where the three-layered film is used, the data erasing speed is lowered. However, in this invention, decrease in the data erasing speed can be suppressed to a minimum even if the three-layered film is used.

In the first embodiment, BPSG film 20 is formed entirely in the concave portion made between the stacked gates. However, it is not necessary to form the BPSG film entirely in the concave portion, and it may be sufficient to planarize the surface to such an extent that the wiring layer cannot be broken. For example, as shown in FIG. 4, it is possible to form BPSG films 20-1 to 20-4 on the side walls of the stacked gates.

FIGS. 5A to 5F sequentially show steps for manufacturing an ultraviolet erasable nonvolatile semiconductor memory device according to a fifth embodiment of this invention. In FIGS. 5A to 5F, portion corresponding to memory cell transistor 11-1 in the first embodiment is mainly shown.

FIG. 5A shows a semiconductor structure in which N$^+$-type diffusion regions 18-1 and 18-2 acting as source and drain regions, first gate oxide film 13-1, floating gate 14-1, second gate oxide film 15-1, control gate 16-1 and thermal oxide film 17 are formed by using an ordinary two-layered polysilicon gate process. That is, a first insulation film, first polysilicon layer, second insulation film and second polysilicon layer are laminatedly formed in this order on a semiconductor substrate (silicon substrate) 12, for example. Then, they are patterned in the same pattern (gate electrode width $\Delta L = 1$ μm) to form floating gate 14-1 and control gate 16-1. Next, N-type impurity is ion-implanted into semiconductor substrate 12 with the stacked gate of floating gate 14-1 and control gate 16-1 as a mask. After this, a heat treatment is effected to anneal the ion-implanted region, thus forming N$^+$-type diffusion regions 18-1 and 18-2 acting as the source and drain regions. At this time, thermal oxide film 17 is formed on semiconductor substrate 12 and on the exposed surface of floating gate 14-1 and control gate 16-1.

Next, as shown in FIG. 5B, SiO$_2$ film (PSG film) 19 containing phosphorus is formed by deposition to a thickness of approx. 1 μm. It is preferable that PSG film 19 contains boron of less than $1 \times 10^{20}$ cm$^{-3}$ so that an ultraviolet ray can easily pass therethrough.

After this, PSG film 19 is selectively etched back by an anisotropic etching method such as RIE method. This causes the thickness $\Delta Y$ of the film on control gate 16-1 and semiconductor substrate 12 to be smaller than width $\Delta X$ of the film on the side walls of floating gate 14-1 and control gate 16-1 as shown in FIG. 5C. This step is effected to keep the aspect ratio of a contact hole to be formed later as small as possible.

Figure 5D:
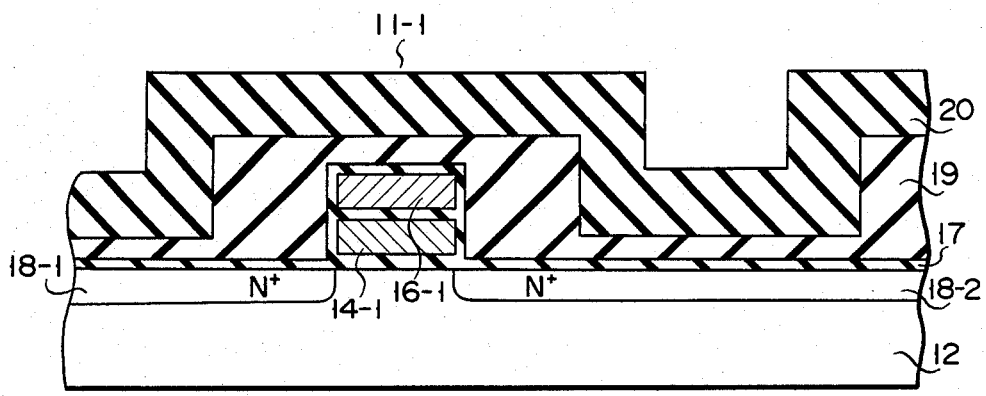
Figure 5E:
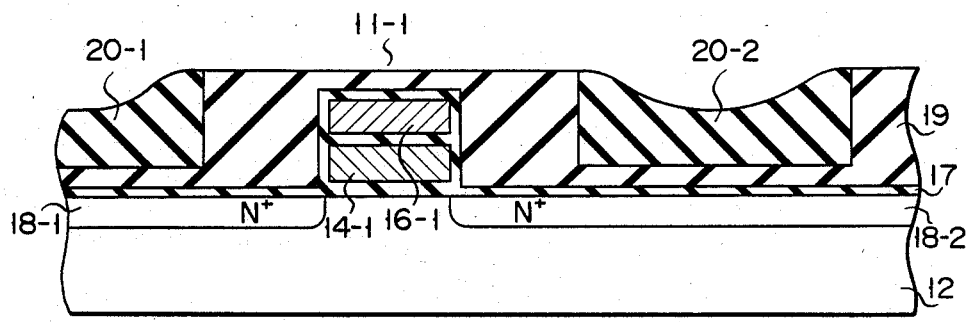

Next, in order to planarize the surface of PSG film 19, SiO$_2$ film (BPSG film) 17 containing boron and phosphorus at a high concentration (both are higher than $1 \times 10^{20}$ cm$^{-3}$) is formed on PSG film 19 by deposition as shown in FIG. 5D. Then, a heat treatment is effected in an atmosphere of N$_2$ at a temperature of 900° C., and BPSG film 20 melts to fill the concave portions of PSG film 19 with BPSG regions 20-1 and 20-2. Thus, the surface of the interlayer insulation film is planarized as shown in FIG. 5E.

Figure 5F:
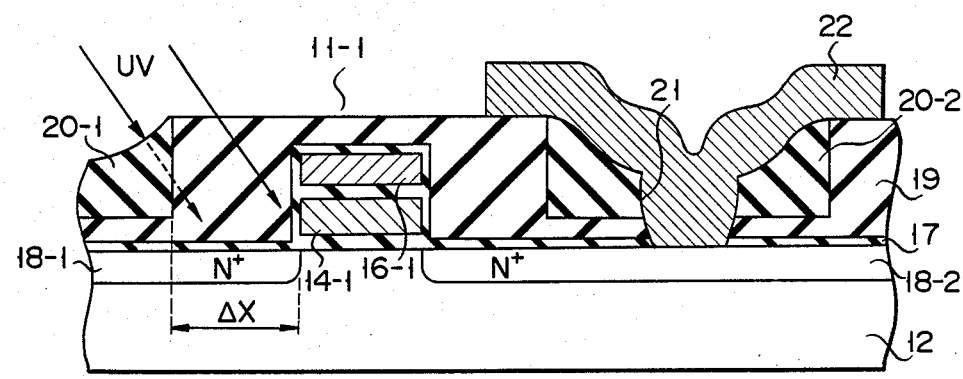

After this, contact hole 21 is formed in the interlayer insulation film on N$^+$-type diffusion layer 18-2. Then, metal wiring layer 22 is formed on the interlayer insulation film and patterned to form a semiconductor structure as shown in FIG. 5F.

As described above, in the fifth embodiment, the interlayer insulation film is formed of thermal oxide film 17, PSG film 19 and BPSG regions 20-1 and 20-2 which are formed on the main surface of semiconductor substrate 12 and around floating gate 14-1 and control gate 16-1. PSG film 19 is formed thinner on control gate 16-1 and semiconductor substrate 12 than on the side walls of floating gate 14-1 and control gate 16-1. It is so constructed because an ultraviolet ray can be easily applied if the film thickness ΔX of PSG film 19 is made large. In other respects, this embodiment is the same as the first embodiment and BPSG regions 20-1 and 20-2 are formed to fill the concave portions on the surface of PSG film 19 to planarize the surface of PSG film 19.

With the construction described above, most portion surrounding the memory cell transistor section (floating gate 14-1 and control gate 16-1) is covered with PSG film 19 through which an ultraviolet ray can easily pass as in the first embodiment, decrease in the data erasing speed can be suppressed to a minimum. Further, since concave portions formed on the surface of PSG film 19 are filled with BPSG regions 20-1 and 20-2 and the surface of the PSG film is planarized, the manufacturing process can be effected at a low temperature. This makes it possible to miniaturize the elements and attain a high integration density.

In the first to fifth embodiments described above, a polysilicon layer of two-layered structure is used to form floating gate 14-1 and 14-2 and control gates 16-1 and 16-2. However, it is also possible to use other material such as refractory metal, the silicide thereof, or a combination of the refractory metal or the silicide and the polysilicon layer in order to attain the same effect. Further, RIE method is used to etch back PSG film 19, but it is also possible to use other anisotropic etching methods. In the step shown in FIG. 5E, BPSG film 20 is not left behind on PSG film 19, but the effect of this invention will not be greatly lowered even if a small amount of BPSG film is left behind. Further, the concentration of phosphorus of PSG film 19 is set to $1 \times 10^{20}$ cm$^{-3}$ and the concentration of boron and phosphorus of BPSG film 20 is set to $1 \times 10^{21}$ cm$^{-3}$, but it is sufficient if the concentrations thereof are set more than $1 \times 10^{18}$ cm$^{-3}$.

As described above, according to this invention, an ultraviolet erasable nonvolatile semiconductor memory device can be provided in which the manufacturing process can be effected at a low temperature while decrease in the data erasing speed can be kept minimum.

What is claimed is:

1. An ultraviolet erasable nonvolatile semiconductor memory device having a stacked gate structure comprising:
   a semiconductor substrate of a first conductivity type;
   at least one memory element having a stacked gate structure formed on said semiconductor substrate;
   a thermal oxide film formed on said semiconductor substrate and around said memory element;
   a silicon oxide film having phosphorus doped therein and formed on said thermal oxide film; and
   a silicon oxide film having boron and phosphorus doped therein and formed in a concave portion on the surface of said phosphorus doped silicon oxide film which lies in position corresponding to the side of said stacked gate.

2. A nonvolatile semiconductor memory device according to claim 1, wherein said memory element includes first and second impurity regions of a second conductivity type formed with a predetermined distance therebetween on the main surface of said semiconductor substrate of the first conductivity type, a first insulation film formed on that portion of said semiconductor substrate which lies between said first and second impurity regions, a floating gate formed on said first insulation film, a second insulation film formed on said floating gate, and a control gate formed on said second insulation film.

3. A nonvolatile semiconductor memory device according to claim 2, wherein said first and second insulation films are each formed of a silicon oxide film.

4. A nonvolatile semiconductor memory device according to claim 2, wherein said first insulation film is formed of a silicon oxide film, and said second insulation film is formed of a laminated structure of a first silicon oxide film, a silicon nitride film and a second silicon oxide film.

5. A nonvolatile semiconductor memory device according to claim 2, wherein each of said floating gate and control gate is formed of a material selected from a group consisting of polysilicon, refractory metal, and silicide of refractory metal.

6. A nonvolatile semiconductor memory device according to claim 1, wherein the concentration of phosphorus in said phosphorus doped silicon oxide film is more than $1 \times 10^{18}$ cm$^{-3}$.

7. A nonvolatile semiconductor memory device according to claim 1, wherein each of the concentrations of said boron and phosphorus in said boron and phosphorus doped silicon oxide film is more than $1 \times 10^{18}$ cm$^{-3}$.

8. A nonvolatile semiconductor memory device according to claim 1, wherein a contact hole is formed in the concave portion on the surface of said phosphorus doped silicon oxide film on which said boron and phosphorus doped silicon oxide film is formed and in said thermal oxide film lying under said concave portion and which further comprises a wiring layer formed on said phosphorus doped silicon oxide film and said boron and phosphorus doped silicon oxide film to fill said contact hole and electrically connected to said memory element.

9. A nonvolatile semiconductor memory device according to claim 1, wherein the film thickness on the side wall of said stacked gate of said phosphorus doped silicon oxide film is set larger than the film thickness on said stacked gate and said semiconductor substrate.

* * * * *